United States Patent
Chang

(10) Patent No.: US 11,108,395 B2
(45) Date of Patent: Aug. 31, 2021

(54) MEMORY CELL AND MEMORY CELL ARRAY OF MAGNETORESISTIVE RANDOM ACCESS MEMORY OPERATED BY NEGATIVE VOLTAGE

(71) Applicant: eMemory Technology Inc., Hsin-Chu (TW)

(72) Inventor: Chia-Fu Chang, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 16/822,983

(22) Filed: Mar. 18, 2020

(65) Prior Publication Data

US 2020/0327917 A1 Oct. 15, 2020

Related U.S. Application Data

(60) Provisional application No. 62/832,853, filed on Apr. 11, 2019.

(51) Int. Cl.
| | |
|---|---|
| *G01C 11/00* | (2006.01) |
| *H03K 19/00* | (2006.01) |
| *H03K 17/16* | (2006.01) |
| *H03K 19/0185* | (2006.01) |
| *H03K 3/356* | (2006.01) |

(Continued)

(52) U.S. Cl.
CPC ......... *H03K 19/0013* (2013.01); *G11C 5/025* (2013.01); *G11C 7/06* (2013.01); *G11C 7/1051* (2013.01); *G11C 7/1084* (2013.01); *G11C 11/1673* (2013.01); *G11C 11/1675* (2013.01); *G11C 11/1697* (2013.01); *G11C 16/08* (2013.01); *G11C 16/14* (2013.01); *G11C 16/16* (2013.01); *G11C 16/24* (2013.01); *G11C 16/26* (2013.01); *H03K 3/356* (2013.01);
(Continued)

(58) Field of Classification Search
CPC ..... H03K 19/0013; G06F 3/262; G11C 5/025; G11C 7/06; G11C 7/1051; G11C 7/1084; G11C 11/1673; G11C 11/1675; G11C 11/1697; G11C 16/08; G11C 16/14; G11C 16/11; G11C 16/24; G11C 16/26
USPC ........................................................ 365/158
See application file for complete search history.

(56) References Cited

U.S. PATENT DOCUMENTS

| | | |
|---|---|---|
| 8,077,508 B1 | 12/2011 | Ong |
| 8,644,055 B2 | 4/2014 | Ney et al. |

(Continued)

OTHER PUBLICATIONS

Partial_search_report issued by EPO dated Jul. 21, 2020.

(Continued)

*Primary Examiner* — Viet Q Nguyen
(74) *Attorney, Agent, or Firm* — WPAT, PC

(57) ABSTRACT

A memory cell of MRAM includes a PMOS transistor and a storage element. A first terminal of the PMOS transistor is connected with a first end of the memory cell. A control terminal of the PMOS transistor is connected with a second end of the memory cell. A first terminal of the storage element is connected with a second terminal of the PMOS transistor. A second terminal of the storage element is connected with a third end of the memory cell. During a write operation, a first voltage is provided to the first end of the memory cell, a second voltage is provided to the third end of the memory cell, and a control voltage is provided to the second end of the memory cell. Consequently, the memory cell is in a first storage state.

14 Claims, 4 Drawing Sheets

(51) Int. Cl.
*H03K 19/0944* (2006.01)
*H03K 17/687* (2006.01)
*G11C 5/02* (2006.01)
*G11C 11/16* (2006.01)
*G11C 7/06* (2006.01)
*G11C 7/10* (2006.01)
*G11C 16/08* (2006.01)
*G11C 16/14* (2006.01)
*G11C 16/24* (2006.01)
*G11C 16/26* (2006.01)
*G11C 16/16* (2006.01)
*G05F 3/26* (2006.01)
*H02M 3/07* (2006.01)

(52) U.S. Cl.
CPC ....... *H03K 17/162* (2013.01); *H03K 17/6871* (2013.01); *H03K 19/018528* (2013.01); *H03K 19/0944* (2013.01); *G05F 3/262* (2013.01); *H02M 3/07* (2013.01)

(56) References Cited

U.S. PATENT DOCUMENTS

| | | | | |
|---|---|---|---|---|
| 9,496,314 B1* | 11/2016 | Lu | ........................ | G11C 11/1659 |
| 9,548,096 B1* | 1/2017 | Li | ........................ | G11C 11/1659 |
| 9,577,009 B1* | 2/2017 | Shih | ..................... | G11C 13/003 |
| 9,842,638 B1* | 12/2017 | Li | ........................ | G11C 29/50 |
| 10,446,213 B1* | 10/2019 | Zhang | ................. | G11C 11/1659 |
| 2013/0016553 A1* | 1/2013 | Rao | ....................... | G11C 13/004 |
| | | | | 365/158 |
| 2014/0016404 A1* | 1/2014 | Kim | ..................... | G11C 7/1057 |
| | | | | 365/158 |
| 2016/0027488 A1* | 1/2016 | Kim | ..................... | G11C 11/1653 |
| | | | | 365/148 |
| 2016/0225428 A1 | 8/2016 | Ohsawa et al. | | |
| 2017/0338405 A1* | 11/2017 | Russell | ................. | H01L 43/02 |
| 2017/0345475 A1* | 11/2017 | Lee | ....................... | G11C 11/005 |
| 2018/0122467 A1* | 5/2018 | Pyo | ....................... | G11C 13/0026 |
| 2018/0287614 A1* | 10/2018 | Jo | ........................ | H03K 19/17744 |
| 2021/0012814 A1* | 1/2021 | Ngueya Wandji | ........................ | |
| | | | | G11C 11/1697 |

OTHER PUBLICATIONS

Hiroki Koike et al., "A Study for Adopting PMOS Memory Cell for 1T1R STT-RAM with Asymmetric Switching Current MTJ", (Sep. 28, 2011), Tohoku University Japan.

Office Action issued by Taiwan Intellectual Property Office dated Nov. 5, 2020.

* cited by examiner

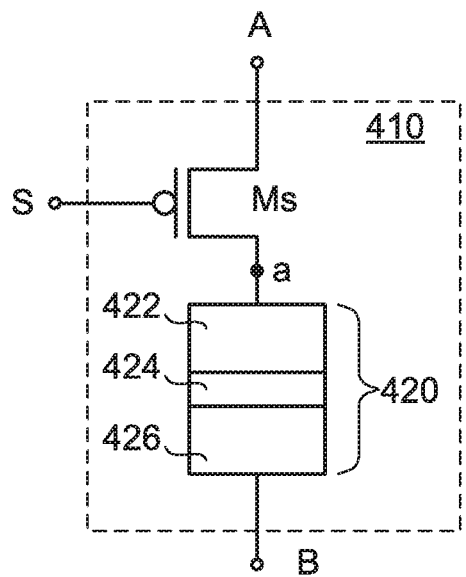
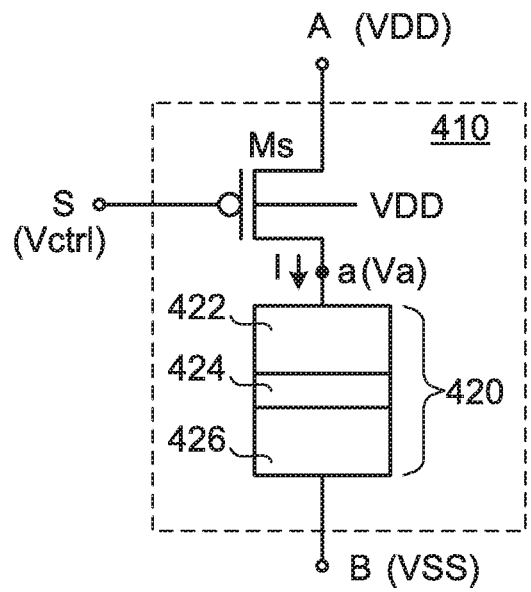
FIG. 4
FIG. 5A
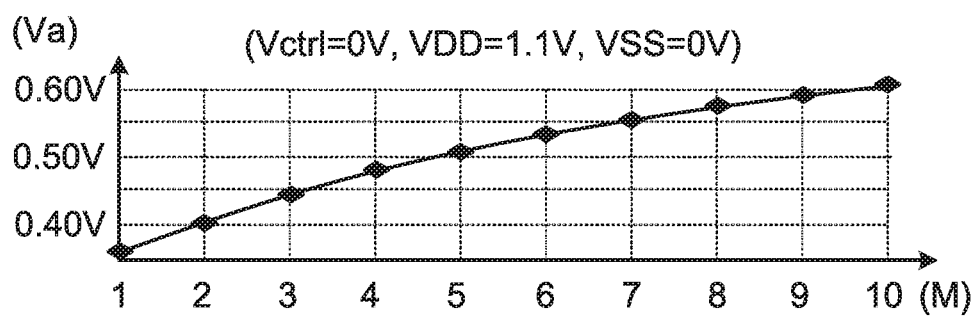
FIG. 5B
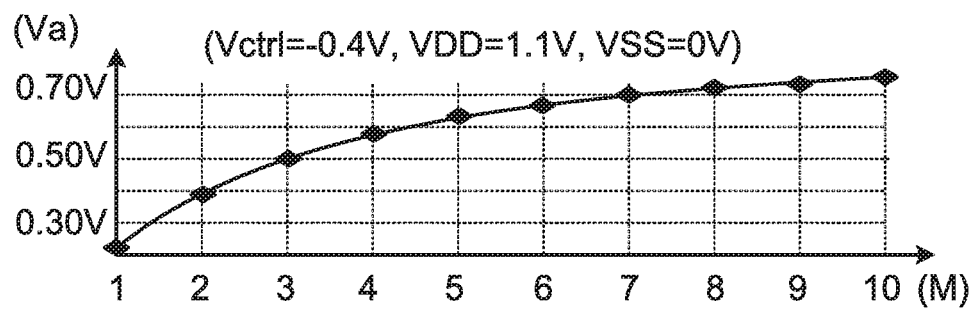
FIG. 5C

MEMORY CELL AND MEMORY CELL ARRAY OF MAGNETORESISTIVE RANDOM ACCESS MEMORY OPERATED BY NEGATIVE VOLTAGE

This application claims the benefit of U.S. provisional application Ser. No. 62/832,853, filed Apr. 11, 2019, the subject matter of which is incorporated herein by reference.

FIELD OF THE INVENTION

The present invention relates to a non-volatile memory, and more particularly to a magnetoresistive random access memory (MRAM) that is operated by a negative voltage.

BACKGROUND OF THE INVENTION

FIG. 1 is a schematic circuit diagram illustrating a conventional MRAM cell. As shown in FIG. 1, the conventional MRAM cell 110 comprises a switch transistor Ms and a storage element 120. The storage element 120 is a magnetic tunnel junction (MTJ).

The MRAM cell 110 has three ends A, B and S. A first terminal of the switch transistor Ms is connected with the end A. A second terminal of the switch transistor Ms is connected with a node "a". A control terminal is connected with the end S. The switch transistor Ms is a NMOS transistor. The gate terminal of the switch transistor Ms is the control terminal.

The storage element 120 comprises a pin layer 122, an isolation layer 124 and a free layer 126, which are arranged in a stack form. The pin layer 122 of the storage element 120 is connected with the node "a". The free layer 126 of the storage element 120 is connected with the end B.

Generally, in case that the magnetization directions of the pin layer 122 and the free layer 126 are different, the storage element 120 has the higher impedance (e.g., 5.2 kohms). Meanwhile, the MRAM cell 110 is in a first storage state, which is also referred as a high impedance state. Whereas, in case that the magnetization directions of the pin layer 122 and the free layer 126 are identical the storage element 120 has the lower impedance (e.g., 3.2 kohms). Meanwhile, the MRAM cell 110 is in a second storage state, which is also referred as a low impedance state. Moreover, by applying the current and voltage in different direction, the MRAM cell 110 is controlled to be in the first storage state or the second storage state.

The MRAM cell 110 as shown in FIG. 1 has other configurations. For example, in another configuration, the pin layer 122 of the storage element 120 is connected with the end B and the free layer 126 of the storage element 120 is connected with the node "a".

FIG. 2A schematically illustrates associated bias voltages for performing a write operation on the conventional MRAM cell to program the conventional MRAM cell into a first storage state. A first voltage VDD is provided to the end A. A second voltage VSS is provided to the end B. For example, the magnitude of the first voltage VDD is 1.1V, and the magnitude of the second voltage VSS is the ground voltage (0V).

Then, a control voltage Vctrl is provided to the end S to control the switch transistor Ms. Consequently, a current I is generated within the MRAM cell 110. The current I flows from the end A to the end B through the node "a". Consequently, the MRAM cell 110 is programmed to the first storage state.

Similarly, the MRAM cell 110 may be programmed into the second storage state through the write operation. That is, the first voltage VDD is provided to the end B, and the second voltage VSS is provided to the end A. When the switch transistor Ms is turned on, the current flows from the end B to the end A through the node "a". Consequently, the MRAM cell 110 is programmed to the second storage state.

Generally, for changing to the first storage state of the MRAM cell 110, a first voltage difference received by the two terminals of the storage element 120 needs to be at least 0.55V. That is, when the voltage of the end B is the second voltage VSS (e.g., 0V) and the voltage Va at the node "a" is higher than 0.55V, the MRAM cell 110 is in the first storage state. Furthermore, for changing to the second storage state of the MRAM cell 110, a second voltage difference received by two terminals of the storage element 120 need to be at least 0.45V. That is, when the voltage of the end B is the first voltage VDD (e.g., 1.1V) and the voltage Va at the node "a" needs to be lower than 0.65V, the MRAM cell 110 is in the second storage state.

As mentioned above, the switch transistor Ms is a NMOS transistor. Consequently, the body terminal of the switch transistor Ms is connected with the lowest voltage (i.e., the second voltage VSS). Moreover, when the first voltage VDD is used as the control voltage Vctrl, the switch transistor Ms is turned on.

However, due to the voltage difference between the body terminal of the switch transistor Ms and the second terminal of the switch transistor Ms (i.e., the node "a"), the switch transistor Ms is possibly suffered from a serious body effect and a serious source degeneration problem. Under this circumstance, the resistance of the switch transistor Ms is very large. Moreover, during the write operation of the MRAM cell 110, the voltage Va at the node "a" cannot reach 0.55V. Under this circumstances, the MRAM cell 110 is almost impossible to be changed to the first storage state.

For decreasing the resistance of the switch transistor Ms, the control voltage Vctrl applied to the end S needs to be increased and thus the voltage Va at the node "a" reaches 0.55V. For example, the control voltage Vctrl applied to the end S is increased from the first voltage VDD (e.g., 1.1V) to 1.5V.

For allowing the switch transistor Ms to comply with the safe operation area (SOA) criteria, the size of the switch transistor Ms has to be increased after the control voltage Vctrl applied to the control terminal of the switch transistor Ms is increased. In other words, the array size of the MRAM cell 110 is also increased.

FIG. 2B is a plot illustrating the relationship between the voltage Va of the node a and the size of the switch transistor Ms in the conventional MRAM cell. For example, when the basic size of the switch transistor Ms is 210 nm×50 nm, M=1. In case that M=2, the size of the switch transistor Ms is twice the basic size. The rest may be deduced by analogy.

Please refer to FIG. 2B again. When the size of the switch transistor Ms is at least eight times the basic size and the control voltage Vctrl is 1.5V, the voltage Va at the node "a" reaches 0.55V and the storage element 120 of the MRAM cell 110 is controlled to be in the first storage state.

In contrast, when size of the switch transistor Ms is smaller than eight times the basic size and the control voltage Vctrl is 1.5V, the voltage Va at the node "a" cannot reach 0.55V. Under this circumstance, the MRAM cell 110 cannot be changed to the first storage state.

As mentioned above, since the size of the switch transistor Ms of the conventional MRAM cell 110 cannot be reduced, the storage density of the MRAM cannot be effectively increased and the fabricating cost of the MRAM cannot be effectively reduced.

Moreover, the conventional method of applying the bias voltages generates other problems, which will be described as follows.

FIG. 3 schematically illustrates associated bias voltages for performing a write operation on the conventional MRAM cell array. The MRAM cell array comprises plural MRAM cells in a row. For succinctness, only two MRAM cells 210 and 310 are shown. The MRAM cells 210 and 310 are connected with a word line WL. The MRAM cell 210 comprises a switch transistor Ms1 and a storage element 220. The MRAM cell 310 comprises a switch transistor Ms2 and a storage element 320. The structures of the MRAM cells 210 and 310 are similar to the structure of the MRAM cell 110 as shown in FIG. 1, and are not redundantly described herein.

The end S1 of the MRAM cell 210 and the end S2 of the MRAM cell 310 are connected with the word line WL. The word line WL is connected with a charge pump 330. The charge pump 330 provides the control voltage Vctrl. The charge pump 330 can increase the magnitude of the first voltage VDD (e.g., 1.1V) to the magnitude of the control voltage Vctrl (e.g., 1.5V).

In the following example, the MRAM cell 210 and the MRAM cell 310 are respectively programmed to the first storage state and the second storage state through the write operation. The other MRAM cells in the same row may be programmed to the first storage state or the second storage state according to the similar method.

Please refer to FIG. 3 again. The end A1 of the MRAM cell 210 receives the first voltage VDD. The end B1 of the MRAM cell 210 receives the second voltage VSS. The end A2 of the MRAM cell 310 receives the second voltage VSS. The end B2 of the MRAM cell 310 receives the first voltage VDD.

When the word line WL receives the control voltage Vctrl and the switch transistors Ms1 and Ms2 are turned on, the current I1 generated within the MRAM cell 210 flows from the end A1 to the end B1 through the node a1 and the current I2 generated within the MRAM cell 310 flows from the end B2 to the end A2 through the node a2. Consequently, the MRAM cell 210 is in the first storage state, and the MRAM cell 310 is in the second storage state.

In the above write operation, the control voltage Vctrl is 1.5V, and the end A2 receives the second voltage VSS (0V). Consequently, the voltage difference between the gate terminal and the source terminal of the switch transistor Ms2 is very high, the switch transistor Ms2 cannot comply with the safe operation area (SOA) criteria. Under this circumstance, the switch transistor Ms2 is damaged.

For overcoming the above drawbacks and controlling the MRAM cell 310 to be in the second storage state during the write operation, the voltage received by the end A2 has to be increased from the second voltage VSS (0V) to a third voltage (e.g., 0.4V). Consequently, the voltage difference between the gate terminal and the source terminal of the switch transistor Ms2 can comply with the SOA criteria.

Obviously, during the write operation of the conventional MRAM cell, the control voltage Vctrl (e.g., 1.5V), the first voltage VDD (e.g., 1.1V), the second voltage VSS (e.g., 0V) and the third voltage (e.g., 0.4V) are provided to the MRAM cell according to the required storage state of the MRAM cell. Consequently, the MRAM cell array can be operated normally.

SUMMARY OF THE INVENTION

An embodiment of the present invention provides a memory cell of a magnetoresistive random access memory. The memory cell includes a PMOS transistor and a storage element. A first terminal of the PMOS transistor is connected with a first end of the memory cell. A control terminal of the PMOS transistor is connected with a second end of the memory cell. A first terminal of the storage element is connected with a second terminal of the PMOS transistor. A second terminal of the storage element is connected with a third end of the memory cell. While a write operation is performed, a first voltage is provided to the first end of the memory cell, a second voltage is provided to the third end of the memory cell, and a control voltage is provided to the second end of the memory cell, so that the memory cell is in a first storage state. A magnitude of the first voltage is higher than a magnitude of the second voltage. The magnitude of the second voltage is higher than a magnitude of the control voltage.

Another embodiment of the present invention provides a memory cell array of a magnetoresistive random access memory. The memory cell array includes a first memory cell and a second memory cell. The first memory cell includes a first PMOS transistor and a first storage element. The second memory cell includes a second PMOS transistor and a second storage element. A first terminal of the first PMOS transistor is connected with a first end of the first memory cell. A control terminal of the first PMOS transistor is connected with a word line. A first terminal of the first storage element is connected with a second terminal of the first PMOS transistor. A second terminal of the first storage element is connected with a second end of the first memory cell. A first terminal of the second PMOS transistor is connected with a first end of the second memory cell. A control terminal of the second PMOS transistor is connected with the word line. A first terminal of the second storage element is connected with a second terminal of the second PMOS transistor. A second terminal of the second storage element is connected with a second end of the second memory cell. While a write operation is performed, a control voltage is provided to the word line, a first voltage difference is provided to two terminals of the first storage element, a second voltage difference is provided to two terminals of the second storage element. Consequently, the first memory cell is in a first storage state and the second memory cell is in a second storage state.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 4 is a schematic circuit diagram illustrating a MRAM cell according to an embodiment of the present invention;

FIG. 5A schematically illustrates associated bias voltages for performing a write operation on the MRAM cell to program the MRAM cell into a first storage state;

FIG. 5B is a plot illustrating the relationship between the voltage Va of the node a and the size of the switch transistor Ms in the MRAM cell of the present invention when the control voltage Vctrl is 0V;

FIG. 5C is a plot illustrating the relationship between the voltage Va of the node a and the size of the switch transistor Ms in the MRAM cell of the present invention when the control voltage Vctrl is −0.4V.

DETAILED DESCRIPTION OF PREFERRED EMBODIMENTS

Figure 1:
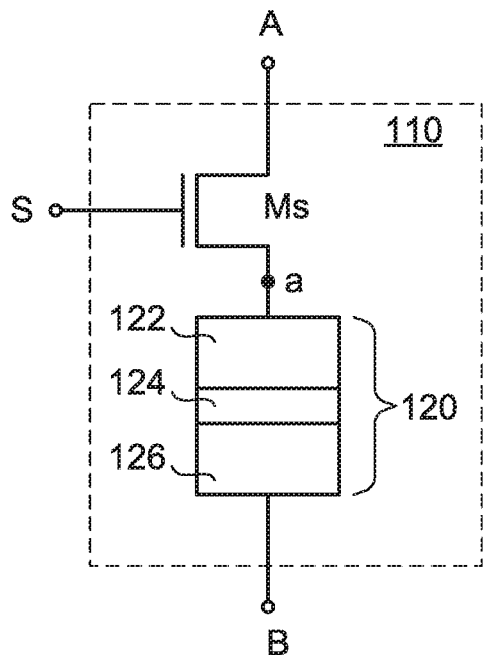
FIG. 1 (prior art) is a schematic circuit diagram illustrating a conventional MRAM cell.
Figure 2A:
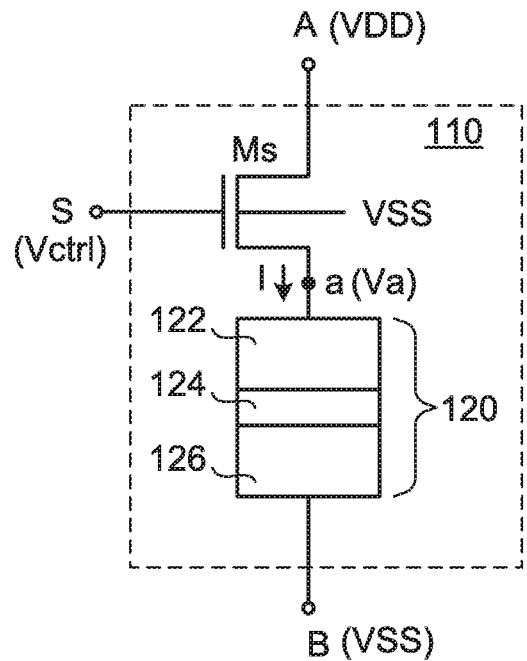
FIG. 2A (prior art) schematically illustrates associated bias voltages for performing a write operation on the conventional MRAM cell to program the conventional MRAM cell into a first storage state.
Figure 2B:
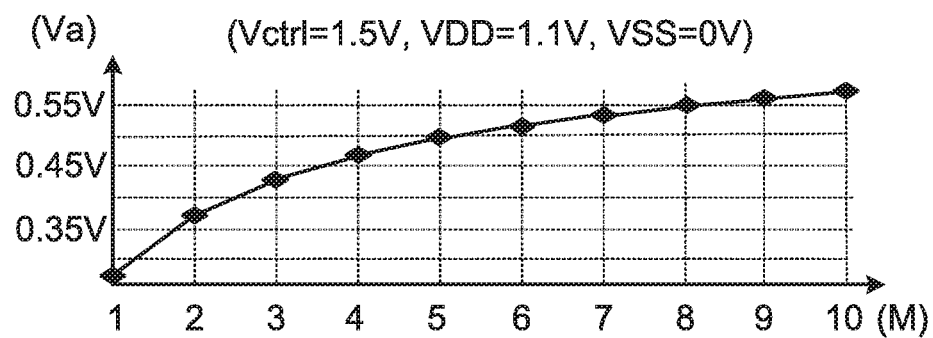
FIG. 2B (prior art) is a plot illustrating the relationship between the voltage Va of the node a and the size of the switch transistor Ms in the conventional MRAM cell.
Figure 3:
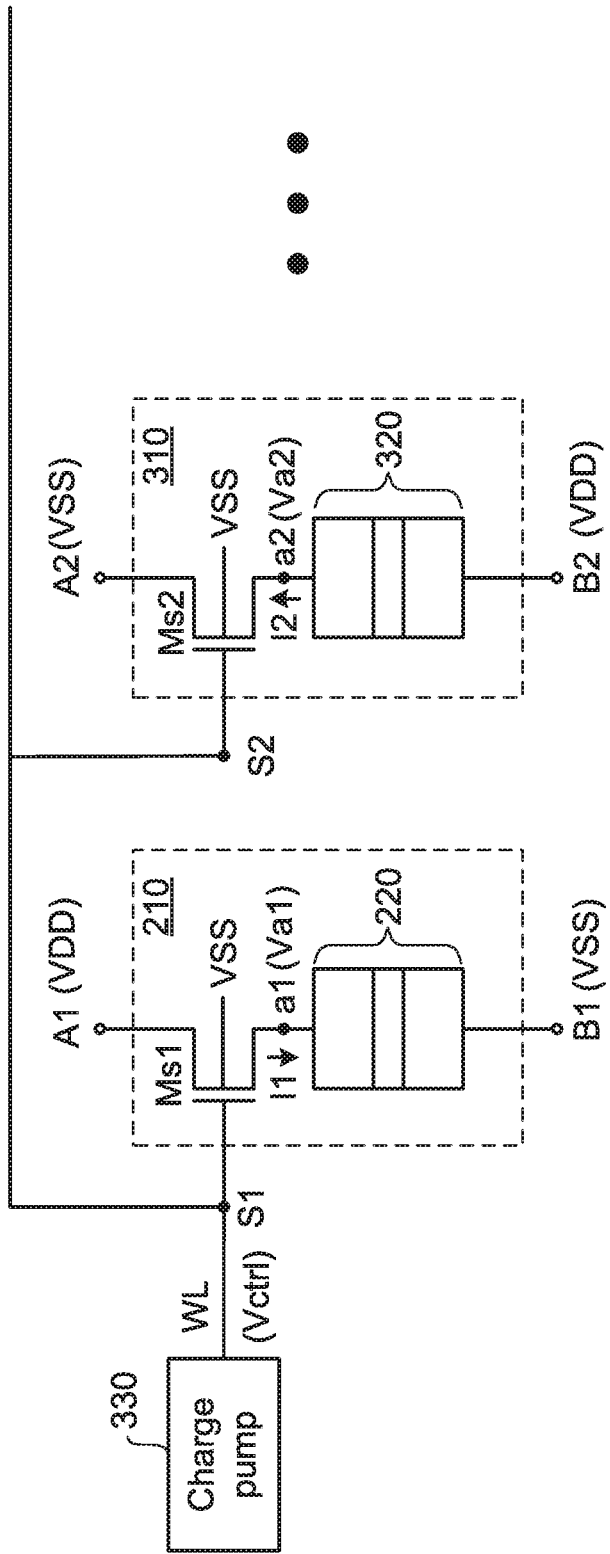
FIG. 3 (prior art) schematically illustrates associated bias voltages for performing a write operation on the conventional MRAM cell array.

FIG. 4 is a schematic circuit diagram illustrating a MRAM cell according to an embodiment of the present invention. As shown in FIG. 4, the MRAM cell 410 comprises a switch transistor Ms and a storage element 420.

The MRAM cell 410 has three ends A, B and S. A first terminal of the switch transistor Ms is connected with the end A. A second terminal of the switch transistor Ms is connected with a node "a". A control terminal is connected with the end S. The switch transistor Ms is a PMOS transistor. The gate terminal of the switch transistor Ms is the control terminal.

The storage element 420 comprises a pin layer 422, an isolation layer 424 and a free layer 426, which are arranged in a stack form. The pin layer 422 of the storage element 420 is connected with the node "a". The free layer 426 of the storage element 420 is connected with the end B.

Generally, in case that the magnetization directions of the pin layer 422 and the free layer 426 are different, the storage element 420 has the higher impedance (e.g., 5.2 kohms). Meanwhile, the MRAM cell 410 is in a first storage state, which is also referred as a high impedance state. Whereas, in case that the magnetization directions of the pin layer 422 and the free layer 426 are identical the storage element 420 has the lower impedance (e.g., 3.2 kohms). Meanwhile, the MRAM cell 410 is in a second storage state, which is also referred as a low impedance state. Moreover, by applying the current and voltage in different direction, the MRAM cell 410 is controlled to be in the first storage state or the second storage state.

The MRAM cell 410 of the present invention has other configurations. For example, in another embodiment, the pin layer 422 of the storage element 420 is connected with the end B and the free layer 426 of the storage element 420 is connected with the node "a".

FIG. 5A schematically illustrates associated bias voltages for performing a write operation on the MRAM cell to program the MRAM cell into a first storage state. A first voltage VDD is provided to the end A. A second voltage VSS is provided to the end B. For example, the magnitude of the first voltage VDD is 1.1V, and the magnitude of the second voltage VSS is the ground voltage (0V). As mentioned above, the switch transistor Ms is a PMOS transistor. Consequently, the body terminal of the switch transistor Ms is connected with the highest voltage (i.e., the first voltage VDD).

Then, a control voltage Vctrl is provided to the end S to control the switch transistor Ms. Consequently, a current I is generated within the MRAM cell 410. The current I flows from the end A to the end B through the node "a". Consequently, the MRAM cell 410 is programmed to the first storage state.

Similarly, the MRAM cell 410 may be programmed into the second storage state through the write operation. That is, the first voltage VDD is provided to the end B, and the second voltage VSS is provided to the end A. When the switch transistor Ms is turned on, the current flows from the end B to the end A through the node "a". Consequently, the MRAM cell 410 is programmed to the second storage state.

Generally, for changing to the first storage state of the MRAM cell 410, the first voltage difference received by the two terminals of the storage element 420 needs to be higher than 0.55V. That is, when the voltage of the end B is the second voltage VSS (e.g., 0V) and the voltage Va at the node "a" is higher than 0.55V, the MRAM cell 410 is in the first storage state. Furthermore, for changing to the second storage state of the MRAM cell 410, the second voltage difference received by two terminals of the storage element 420 need to be at least 0.45V. That is, when the voltage of the end B is the first voltage VDD (e.g., 1.1V) and the voltage Va at the node "a" is lower than 0.65V, the MRAM cell 410 is in the second storage state.

In this embodiment, the body terminal of the switch transistor Ms and the first terminal of the switch transistor Ms (i.e., the end A) are connected with the first voltage VDD, the switch transistor Ms is not suffered from the serious body effect. Consequently, during the write operation of the MRAM cell 410, the resistance of the switch transistor Ms is low.

FIG. 5B is a plot illustrating the relationship between the voltage Va of the node a and the size of the switch transistor Ms in the MRAM cell of the present invention when the control voltage Vctrl is 0V. For example, when the basic size of the switch transistor Ms is 210 nm×50 nm, M=1. In case that M=2, the size of the switch transistor Ms is twice the basic size. The rest may be deduced by analogy.

Please refer to FIG. 5B. When the size of the switch transistor Ms is at least eight times the basic size and the control voltage Vctrl is 0V, the voltage Va at the node "a" reaches 0.55V and the MRAM cell 410 is controlled to be in the first storage state.

In addition to the control voltage Vctrl of 0V, adjusting the control voltage Vctrl to be lower than 0V can further reduce the size of the switch transistor Ms. FIG. 5C is a plot illustrating the relationship between the voltage Va of the node a and the size of the switch transistor Ms in the MRAM cell of the present invention when the control voltage Vctrl is −0.4V.

Please refer to FIG. 5C. When the size of the switch transistor Ms is at least four times the basic size and the control voltage Vctrl is −0.4V, the voltage Va at the node "a" reaches 0.55V and the storage element 420 of the MRAM cell 410 is controlled to be in the first storage state.

From the above description, the use of the smaller-size PMOS transistor as the switch transistor Ms and the provision of the negative control voltage Vctrl can effectively reduce the resistance of the switch transistor Ms and control the MRAM cell 410 to be in the first storage state successfully.

Figure 6:
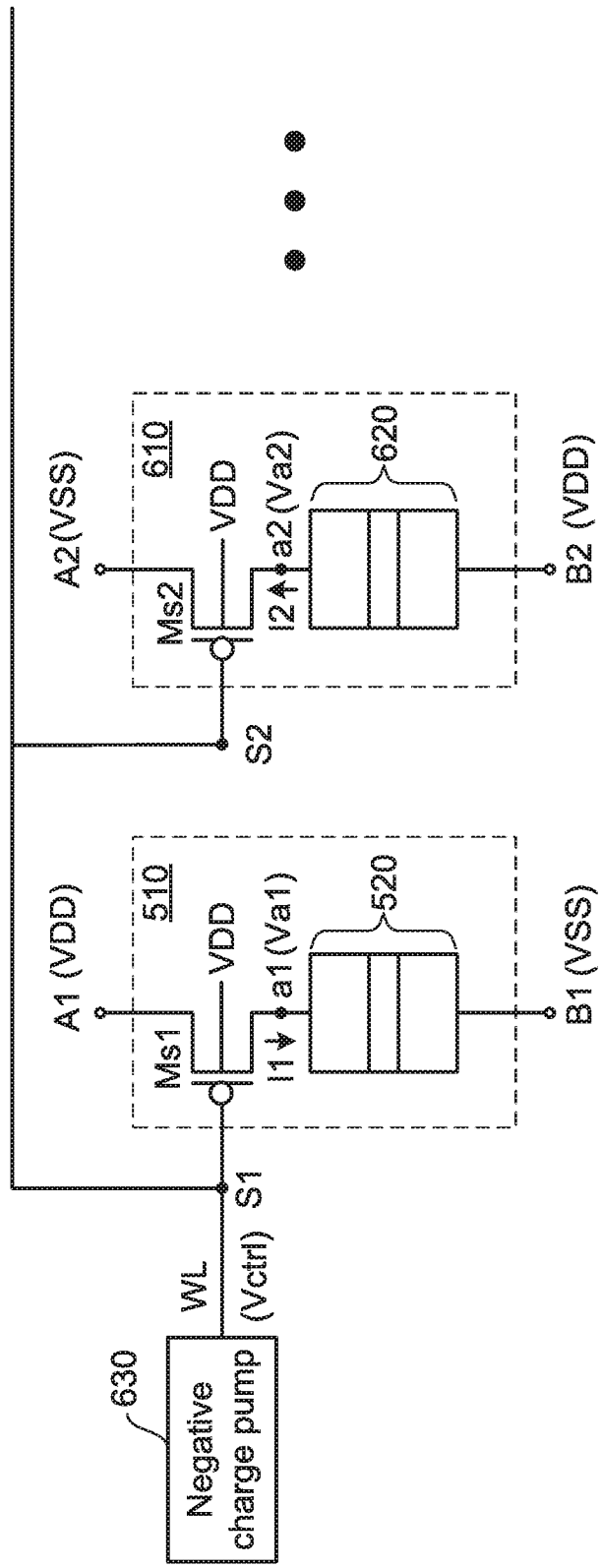
FIG. 6 schematically illustrates associated bias voltages for performing a write operation on the MRAM cell array of the present invention.

FIG. 6 schematically illustrates associated bias voltages for performing a write operation on the MRAM cell array of the present invention. The MRAM cell array comprises plural MRAM cells in a row. For succinctness, only two MRAM cells 510 and 610 are shown. The MRAM cells 510 and 610 are connected with a word line WL. The MRAM cell 510 comprises a switch transistor Ms1 and a storage element 520. The MRAM cell 610 comprises a switch transistor Ms2 and a storage element 620. The structures of the MRAM cells 510 and 610 are similar to the structure of the MRAM cell 410 as shown in FIG. 4, and are not redundantly described herein.

The end S1 of the MRAM cell 510 and the end S2 of the MRAM cell 610 are connected with the word line WL. The word line WL is connected with a negative charge pump 630. The negative charge pump 630 provides the control voltage Vctrl with a negative voltage level. For example, the negative charge pump 630 can decrease the magnitude of the second voltage VSS (e.g., 0V) to the magnitude of the control voltage Vctrl (e.g., −0.4V).

In the following example, the MRAM cell 510 and the MRAM cell 610 are respectively programmed to the first storage state and the second storage state through the write operation. The other MRAM cells in the same row may be programmed to the first storage state or the second storage state according to the similar method.

Please refer to FIG. 6 again. The end A1 of the MRAM cell 510 receives the first voltage VDD. The end B1 of the MRAM cell 510 receives the second voltage VSS. The end A2 of the MRAM cell 610 receives the second voltage VSS. The end B2 of the MRAM cell 610 receives the first voltage VDD.

When the word line WL receives the control voltage Vctrl with the negative voltage level and the switch transistors Ms1 and Ms2 are turned on, the current I1 generated within the MRAM cell 510 flows from the end A1 to the end B1 through the node a1 and the current I2 generated within the MRAM cell 610 flows from the end B2 to the end A2 through the node a2. Consequently, the MRAM cell 510 is in the first storage state, and the MRAM cell 610 is in the second storage state.

In the above embodiment, the body terminal of the switch transistor Ms is connected with the first voltage VDD. It is noted that numerous modifications and alterations may be made while retaining the teachings of the invention. For example, in another embodiment, the body terminal of the switch transistor is connected with another voltage (e.g., a fourth voltage) at a proper time. The magnitude of the fourth voltage is equal to the voltage Va at the node "a". Or, in another embodiment, the end A1 of the MRAM cell 510 receives a regulator voltage less than the first voltage VDD, if there is a need that the switch transistor Ms1 should comply with the safe operation area (SOA) criteria.

From the above description, the present invention provides a magnetoresistive random access memory (MRAM) that is operated by a negative voltage. The magnetoresistive random access memory comprises a MRAM cell array. The MRAM cell array is connected with a word line WL. The MRAM cell array comprises plural MRAM cells. Each MRAM cell comprises a switch transistor and a storage element. The switch transistor is a PMOS transistor.

During the write operation, the control voltage with the negative voltage level is provided to the word line, and the first voltage VDD and the second voltage VSS are provided to the two ends A and B of the MRAM cell. Consequently, the MRAM cell is controlled to be in the first storage state or the second storage state. The magnitude of the first voltage VDD is higher than the magnitude of the second voltage VSS. The magnitude of the second voltage VSS is higher than the magnitude of the control voltage Vctrl. Since the size of the switch transistor of the MRAM cell is reduced, the storage density of the MRAM is effectively increased and the fabricating cost of the MRAM is effectively reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory cell of a magnetoresistive random access memory, the memory cell comprising:
   a PMOS transistor, wherein a first terminal of the PMOS transistor is connected with a first end of the memory cell, and a control terminal of the PMOS transistor is connected with a second end of the memory cell; and
   a storage element, wherein a first terminal of the storage element is connected with a second terminal of the PMOS transistor, and a second terminal of the storage element is connected with a third end of the memory cell,
   wherein while a write operation is performed, a first voltage is provided to the first end of the memory cell, a second voltage is provided to the third end of the memory cell, and a control voltage is provided to the second end of the memory cell, so that the memory cell is in a first storage state,
   wherein a magnitude of the first voltage is higher than a magnitude of the second voltage, and the magnitude of the second voltage is higher than a magnitude of the control voltage.

2. The memory cell as claimed in claim 1, wherein while the write operation is performed, the second voltage is provided to the first end of the memory cell, the first voltage is provided to the third end of the memory cell, and the control voltage is provided to the second end of the memory cell, so that the memory cell is in a second storage state.

3. The memory cell as claimed in claim 2, wherein a voltage level of the first voltage is positive, the second voltage is a ground voltage, and a voltage level of the control voltage is negative.

4. The memory cell as claimed in claim 1, wherein the storage element comprises a pin layer, an isolation layer and a free layer, which are arranged in a stack form, wherein the pin layer is connected with the second terminal of the PMOS transistor, and the free layer is connected with the third end of the memory cell.

5. The memory cell as claimed in claim 1, wherein the storage element comprises a pin layer, an isolation layer and a free layer, which are arranged in a stack form, wherein the free layer is connected with the second terminal of the PMOS transistor, and the pin layer is connected with the third end of the memory cell.

6. The memory cell as claimed in claim 1, wherein a body terminal of the PMOS transistor is connected with the first voltage.

7. The memory cell as claimed in claim 1, wherein a body terminal of the PMOS transistor is connected with a fourth voltage.

8. The memory cell as claimed in claim 1, wherein the magnitude of the second voltage is decreased to the magnitude of the control voltage through a negative charge pump.

9. A memory cell array of a magnetoresistive random access memory, the memory cell array comprising:
   a first memory cell comprising a first PMOS transistor and a first storage element; and
   a second memory cell comprising a second PMOS transistor and a second storage element;
   wherein a first terminal of the first PMOS transistor is connected with a first end of the first memory cell, a control terminal of the first PMOS transistor is connected with a word line, a first terminal of the first storage element is connected with a second terminal of the first PMOS transistor, and a second terminal of the first storage element is connected with a second end of the first memory cell,
   wherein a first terminal of the second PMOS transistor is connected with a first end of the second memory cell, a control terminal of the second PMOS transistor is connected with the word line, a first terminal of the second storage element is connected with a second terminal of the second PMOS transistor, and a second terminal of the second storage element is connected with a second end of the second memory cell,
   wherein while a write operation is performed, a control voltage is provided to the word line, a first voltage difference is provided to two terminals of the first storage element, a second voltage difference is provided to two terminals of the second storage element, so that the first memory cell is in a first storage state and the second memory cell is in a second storage state,
   wherein while the write operation is performed, a first voltage is provided to the first end of the first memory cell, a second voltage is provided to the second end of the first memory cell, the second voltage is provided to the first end of the second memory cell, the first voltage is provided to the second end of the second memory cell, a magnitude of the first voltage is higher than a magnitude of the second voltage, and the magnitude of the second voltage is higher than a magnitude of the control voltage.

10. The memory cell array as claimed in claim 9, wherein a voltage level of the first voltage is positive, the second voltage is a ground voltage, and a voltage level of the control voltage is negative.

11. The memory cell array as claimed in claim 9, wherein the first storage element comprises a pin layer, an isolation layer and a free layer, which are arranged in a stack form, wherein the pin layer is connected with the second terminal of the first PMOS transistor, and the free layer is connected with the second end of the first memory cell.

12. The memory cell array as claimed in claim 9, wherein the first storage element comprises a pin layer, an isolation layer and a free layer, which are arranged in a stack form, wherein the free layer is connected with the second terminal of the first PMOS transistor, and the pin layer is connected with the second end of the first memory cell.

13. The memory cell array as claimed in claim 9, wherein a body terminal of the first PMOS transistor and a body terminal of the second PMOS transistor are connected with the first voltage.

14. The memory cell array as claimed in claim 9, wherein the magnitude of the second voltage is decreased to the magnitude of the control voltage through a negative charge pump.

* * * * *